US008294125B2

(12) United States Patent
Han et al.

(10) Patent No.: US 8,294,125 B2
(45) Date of Patent: Oct. 23, 2012

(54) HIGH-SENSITIVITY AND HIGH-THROUGHPUT ELECTRON BEAM INSPECTION COLUMN ENABLED BY ADJUSTABLE BEAM-LIMITING APERTURE

(75) Inventors: Liqun Han, Pleasanton, CA (US); Marian Mankos, Palo Alto, CA (US); Xinrong Jiang, Palo Alto, CA (US); Rex Runyon, Fremont, CA (US); John Greene, Santa Cruz, CA (US)

(73) Assignee: KLA-Tencor Corporation, Milpitas, CA (US)

(*) Notice: Subject to any disclaimer, the term of this patent is extended or adjusted under 35 U.S.C. 154(b) by 391 days.

(21) Appl. No.: 12/634,444

(22) Filed: Dec. 9, 2009

(65) Prior Publication Data
US 2011/0114838 A1 May 19, 2011

Related U.S. Application Data

(60) Provisional application No. 61/262,494, filed on Nov. 18, 2009.

(51) Int. Cl.
*H01J 37/20* (2006.01)
*H01J 37/29* (2006.01)
*G01N 23/225* (2006.01)

(52) U.S. Cl. ............ 250/492.23; 250/492.1; 250/492.2; 250/492.22; 250/397; 250/398

(58) Field of Classification Search ............ 250/492.22, 250/492.23
See application file for complete search history.

(56) References Cited

U.S. PATENT DOCUMENTS

| | | | |
|---|---|---|---|
| 5,359,202 A | 10/1994 | Yasuda et al. | |
| 5,763,889 A | 6/1998 | Tomita et al. | |
| 5,932,884 A * | 8/1999 | Aizaki | 250/492.23 |
| 5,981,962 A * | 11/1999 | Groves et al. | 250/492.23 |
| 6,166,387 A * | 12/2000 | Muraki et al. | 250/492.2 |
| 6,175,122 B1 * | 1/2001 | Groves et al. | 250/492.23 |
| 6,274,877 B1 * | 8/2001 | Muraki | 250/492.23 |
| 6,323,499 B1 * | 11/2001 | Muraki et al. | 250/492.22 |
| 6,376,850 B1 | 4/2002 | Zhang | |
| 6,570,154 B1 * | 5/2003 | Masnaghetti et al. | 250/310 |
| 6,593,584 B2 | 7/2003 | Krans et al. | |

(Continued)

FOREIGN PATENT DOCUMENTS
EP 1304717 4/2003
(Continued)

OTHER PUBLICATIONS

PCT International Preliminary Report on Patentability for Application No. PCT/US2010/056048, May 22, 2012, 6 pgs.

*Primary Examiner* — David A Vanore
(74) *Attorney, Agent, or Firm* — Okamoto & Benedicto LLP

(57) ABSTRACT

One embodiment relates to an electron-beam apparatus for defect inspection and/or review of substrates or for measuring critical dimensions of features on substrates. The apparatus includes an electron gun and an electron column. The electron gun includes an electron source configured to generate electrons for an electron beam and an adjustable beam-limiting aperture which is configured to select and use one aperture size from a range of aperture sizes. Another embodiment relates to providing an electron beam in an apparatus. Advantageously, the disclosed apparatus and methods reduce spot blur while maintaining a high beam current so as to obtain both high sensitivity and high throughput.

18 Claims, 10 Drawing Sheets

U.S. PATENT DOCUMENTS

| | | | |
|---|---|---|---|
| 6,768,125 B2 * | 7/2004 | Platzgummer et al. | 250/492.22 |
| 6,989,546 B2 * | 1/2006 | Loschner et al. | 250/492.22 |
| 7,262,418 B2 * | 8/2007 | Lo et al. | 250/396 R |
| 7,276,714 B2 * | 10/2007 | Platzgummer et al. | 250/492.22 |
| 7,368,738 B2 * | 5/2008 | Platzgummer | 250/492.23 |
| 7,781,748 B2 * | 8/2010 | Platzgummer | 250/492.22 |
| 7,821,187 B1 * | 10/2010 | Jiang et al. | 313/361.1 |
| 7,868,307 B2 * | 1/2011 | Kruit | 250/492.22 |
| 7,906,761 B2 * | 3/2011 | Tanimoto et al. | 250/310 |
| 8,026,495 B2 * | 9/2011 | Platzgummer | 250/492.22 |
| 2006/0163480 A1 | 7/2006 | Koyama et al. | |
| 2008/0185517 A1 | 8/2008 | Frosien | |

FOREIGN PATENT DOCUMENTS

JP    2007-273368    10/2007

* cited by examiner

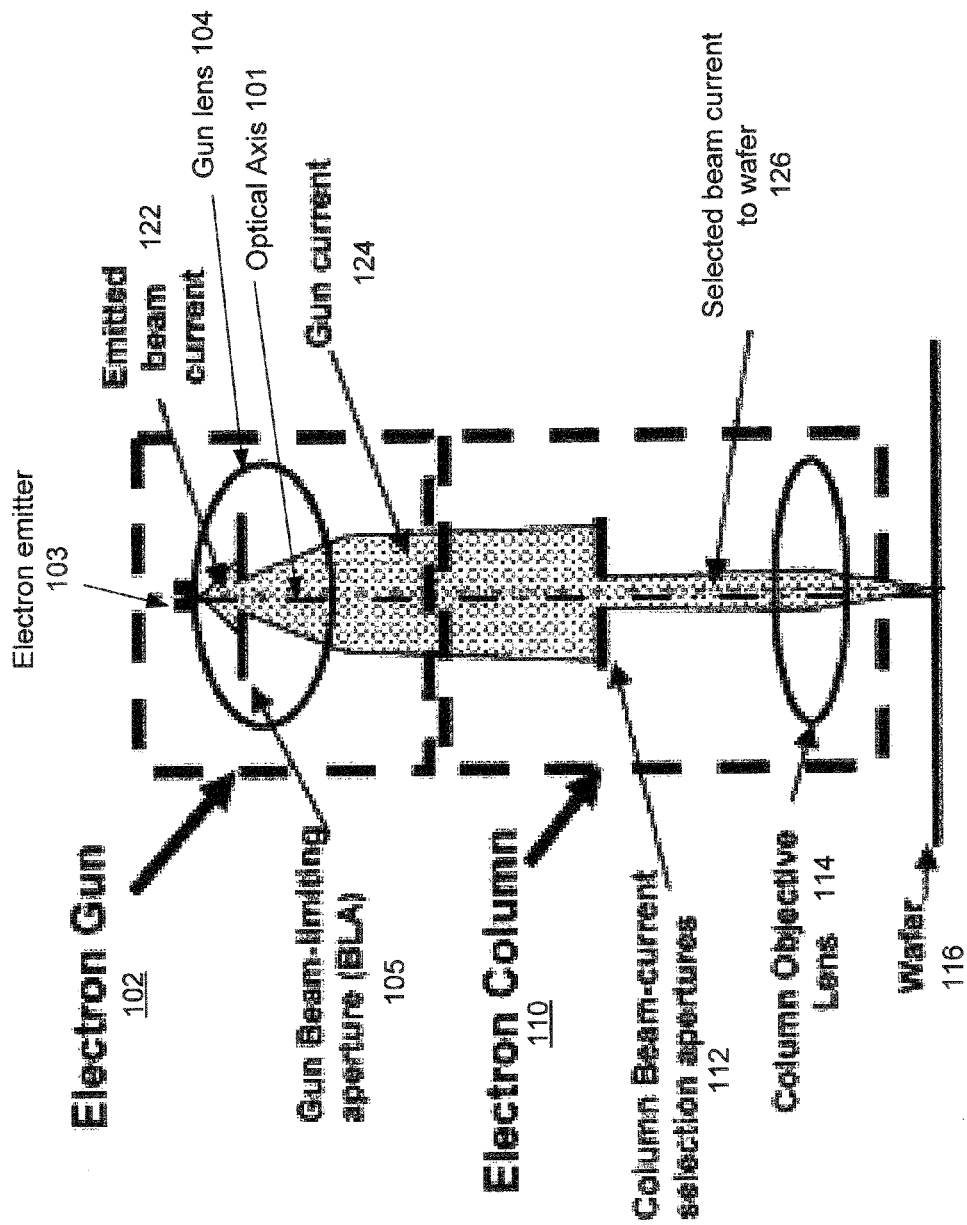
FIG. 1
(Conventional)

|  | Fine Control | |
|---|---|---|
|  | Low Ja | High Ja |
| Rough Control Small BLA | Range 1: Imin to I1 | Range 2: I1 to I2 |
| Large BLA | Range 3: I2 to I3 | Range 4: I3 to I4 |

FIG. 11

HIGH-SENSITIVITY AND HIGH-THROUGHPUT ELECTRON BEAM INSPECTION COLUMN ENABLED BY ADJUSTABLE BEAM-LIMITING APERTURE

CROSS-REFERENCE TO RELATED APPLICATION

The present application claims the benefit of U.S. Provisional Patent Application No. 61/262,494, filed on Nov. 18, 2009, which is incorporated herein by reference in its entirety.

BACKGROUND

1. Technical Field

The present invention relates generally to electron beam (e-beam) inspection apparatus and methods of using same.

2. Description of the Background Art

Automated inspection and review systems are important in process control and yield management for the semiconductor and related microelectronics industries. Such systems include optical and electron beam (e-beam) based systems.

In the manufacture of semiconductor devices, detection of defects early on in the development and fabrication process is becoming increasingly important to shorten product development cycles and increase manufacturing yield. Advanced wafer inspection and review systems based on scanning electron microscopy technology are being used to detect, review and classify defects and feed the root cause information back into the manufacturing process to prevent these defects going forward. The size of relevant defects is directly proportional to the design rule being applied to the manufacturing of the semiconductor devices. As the latter continues to shrink the performance demands on wafer inspection and review SEMs increases both in terms of imaging resolution and speed (defects processed per hour).

SUMMARY

One embodiment relates to an electron-beam apparatus for defect inspection and/or review of substrates or for measuring critical dimensions of features on substrates. The apparatus includes an electron gun and an electron column. The electron gun includes an electron source configured to generate electrons for an electron beam and an adjustable beam-limiting aperture which is configured to select and use one aperture size from a range of aperture sizes. The electron column includes an objective lens for focusing the electron beam onto the target area, a movable substrate holder for holding the substrate, and a detector configured to detect signal electrons (i.e. secondary electrons and/or backscattered electrons).

Another embodiment relates to providing an electron beam in an apparatus. Electrons for an electron beam are generated by an electron source in an electron gun. An adjustable beam-limiting aperture with a range of aperture sizes is provided in the electron gun, and one aperture size is selected from the range of aperture sizes of the adjustable beam-limiting aperture. The electron beam is focused onto a target area of the substrate, and signal electrons are detected.

Another embodiment relates to a method of providing an electron beam in an electron imaging apparatus. A beam current to be used in the apparatus is set by a user. A range of beam currents which includes said user-set beam current is provided by selecting a size of an adjustable beam-limiting aperture in the electron gun and by selecting a size of a beam-current selection aperture.

Advantageously, the disclosed apparatus and methods reduce spot blur while maintaining a high beam current so as to obtain both high sensitivity and high throughput. This is a synergistic result which is counter to the conventional trade-off between sensitivity (resolution) and throughput (speed).

BRIEF DESCRIPTION OF THE DRAWINGS

FIG. 1 is a schematic diagram showing select components of a conventional electron beam tool for semiconductor applications.

FIG. 11 is a schematic diagram showing a matrix for controlling beam current in accordance with an embodiment of the invention.

DETAILED DESCRIPTION

Figure 2:
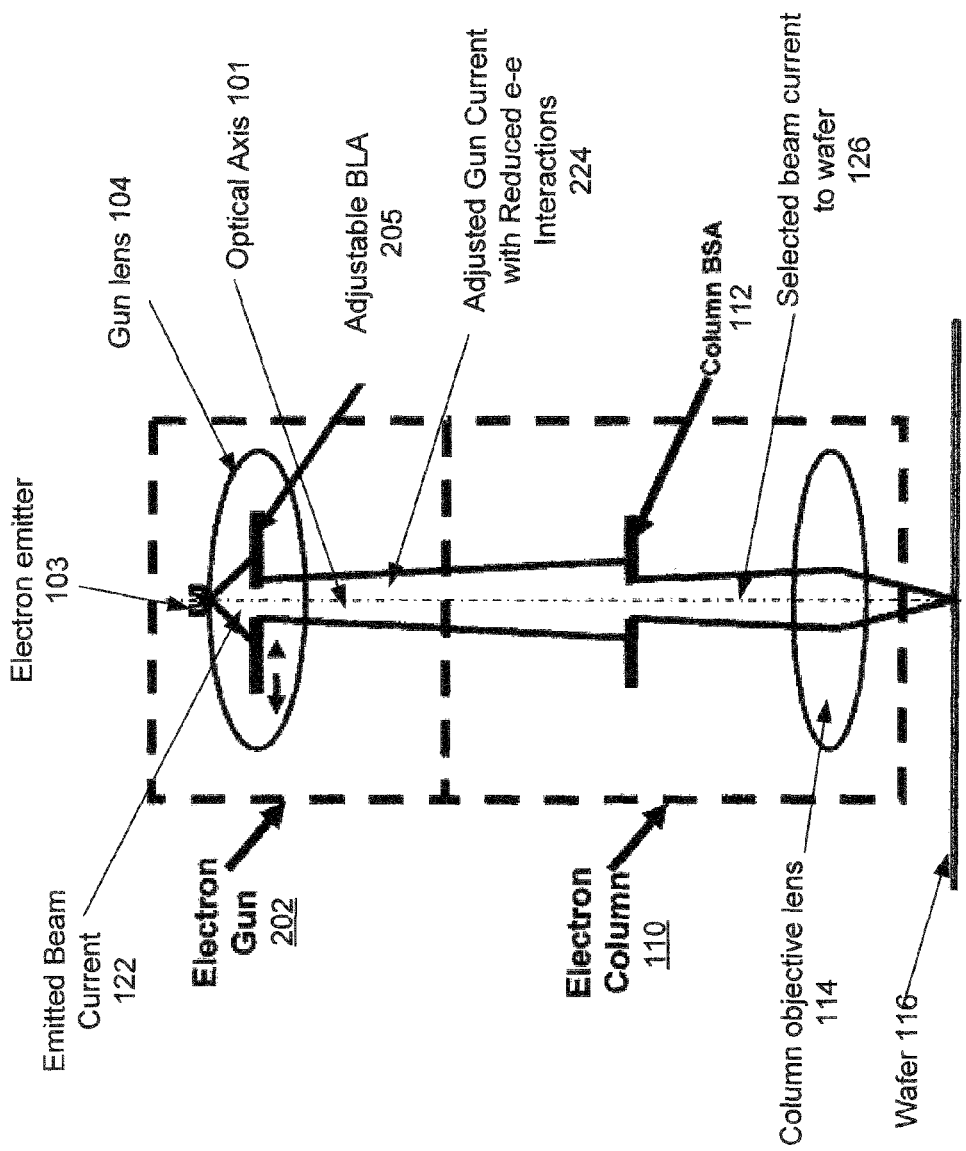
FIG. 2 is a schematic diagram showing select components of an electron beam tool for semiconductor applications in accordance with a first embodiment of the invention.

Electron beam (e-beam) imaging apparatus are utilized for various applications relating to semiconductor manufacturing. These applications include, automated e-beam inspection for defects, automated defect review, and critical dimension measurements (CD-SEM).

Applicants have determined that conventional e-beam tools for applications in semiconductor manufacturing have a substantial drawback or limitation in terms of the trade-off between sensitivity (or resolution) and performance. Sensitivity of an e-beam tool to very small defects is related to the imaging resolution of the tool. In order to improve the imaging resolution of a conventional e-beam inspection (or defect review or CD-SEM) tool, a very low beam current is required. Unfortunately, a very low beam current results in very low performance in terms of throughput. On the other hand, in order to provide high performance in terms of throughput, a high beam current is required. However, a high beam current results in low resolution imaging.

The present application discloses modifications to a conventional e-beam tool for semiconductor applications. These modifications enable improvement of the ultimate resolution of an e-beam tool without compromising the performance requirement of high throughput. This result is unexpected as it overcomes the conventional wisdom regarding the trade-off between resolution and performance.

FIG. 1 is a schematic diagram showing select components of a conventional e-beam tool for semiconductor applications, including a beam-limiting aperture (BLA or gun BLA) 105 in an electron gun (electron beam gun) 102 and a beam-current selection aperture 112 (BSA or column BSA) in an electron column (electron beam column) 110. The electron gun 102 and electron column 110 generally include vacuum systems to pump air out of the gun and column chambers so as to provide a high vacuum within those chambers.

In the conventional scanning electron microscope, an electron emitter 103 generates electrons within the gun chamber, and an electron gun lens 104 is configured within the gun chamber to focus the emitted electrons so as to form an electron beam. The BLA 105 is a fixed aperture which reduces the beam by only allowing a portion of the beam through an opening of the aperture, where the center of the opening is along the optical axis 101 of the apparatus.

The electron beam (being formed by the gun lens 104 and after passing through the BLA 105) exits the electron gun 102 and enters the electron column 110 (centered along the optical axis of the apparatus). In FIG. 1, the gun current 124 refers to the current of the electron beam between the gun BLA 105 and the column BSA 112.

The column BSA 112 is configured so as to provide a plurality of selectable apertures so as to select a beam current 126 which continues on to the wafer. The selected beam current 126 is focused by the objective lens 114 of the electron column 110 onto the wafer 116.

Applicants note that, in a conventional e-beam tool for semiconductor applications, the beam limiting aperture (BLA) and angular current density (Ja) of the electron source are fixed at constant values. The fixed BLA size and the fixed Ja generally depend in large part on whether the application is a low or high beam current (BC) application. Low BC applications, such as e-beam review and CD-SEM, typically use a beam current of less than 5 nanoamperes (nA), while high BC applications, such as e-beam inspection, typically use a beam current of greater than 100 nA.

In low BC applications, a small fixed BLA and a lower fixed Ja are generally used to achieve a required ultra-high resolution. For example, the small fixed BLA may have a diameter in a range from 5 to 50 microns, and the lower fixed Ja may be in a range from 0.2 to 1 milliamperes/steradian (mA/sr) so as to achieve a resolution of about 1 nanometer (nm).

On the other hand, in high BC applications, a large fixed BLA and a higher fixed Ja are generally used to meet a required high throughput rate. For example, the large fixed BLA may have a diameter in a range from 100 to 500 microns, and the higher fixed Ja may be in a range from 0.5 to 3 mA/sr.

Applicants have determined that electron-electron interactions in the gun current 124 contributes substantially to spot blur on the wafer 116. Applicants have further determined specific modifications to the electron gun and/or the electron column to reduce this spot blur while maintaining a high BC so as to obtain both high sensitivity and high throughput.

FIG. 2 is a schematic diagram showing select components of an e-beam tool for semiconductor applications in accordance with an embodiment of the invention. As seen in FIG. 2, an adjustable BLA 205 is arranged within the electron gun 202.

The adjustable BLA 205 enables the e-beam tool to reduce spot blur while maintaining a high BC. By adjusting the size of the BLA 205, the gun current 224 may be controllably adjusted so as to reduce electron-electron (e-e) interactions between the gun BLA 205 and the column BSA 112. As a result, a high beam current 126 may be selected by the column BSA 112, but the spot blur on the wafer is substantially decreased because of the reduced e-e interactions higher up in the column (between the adjustable BLA 205 and the column BSA 112).

Figure 3:
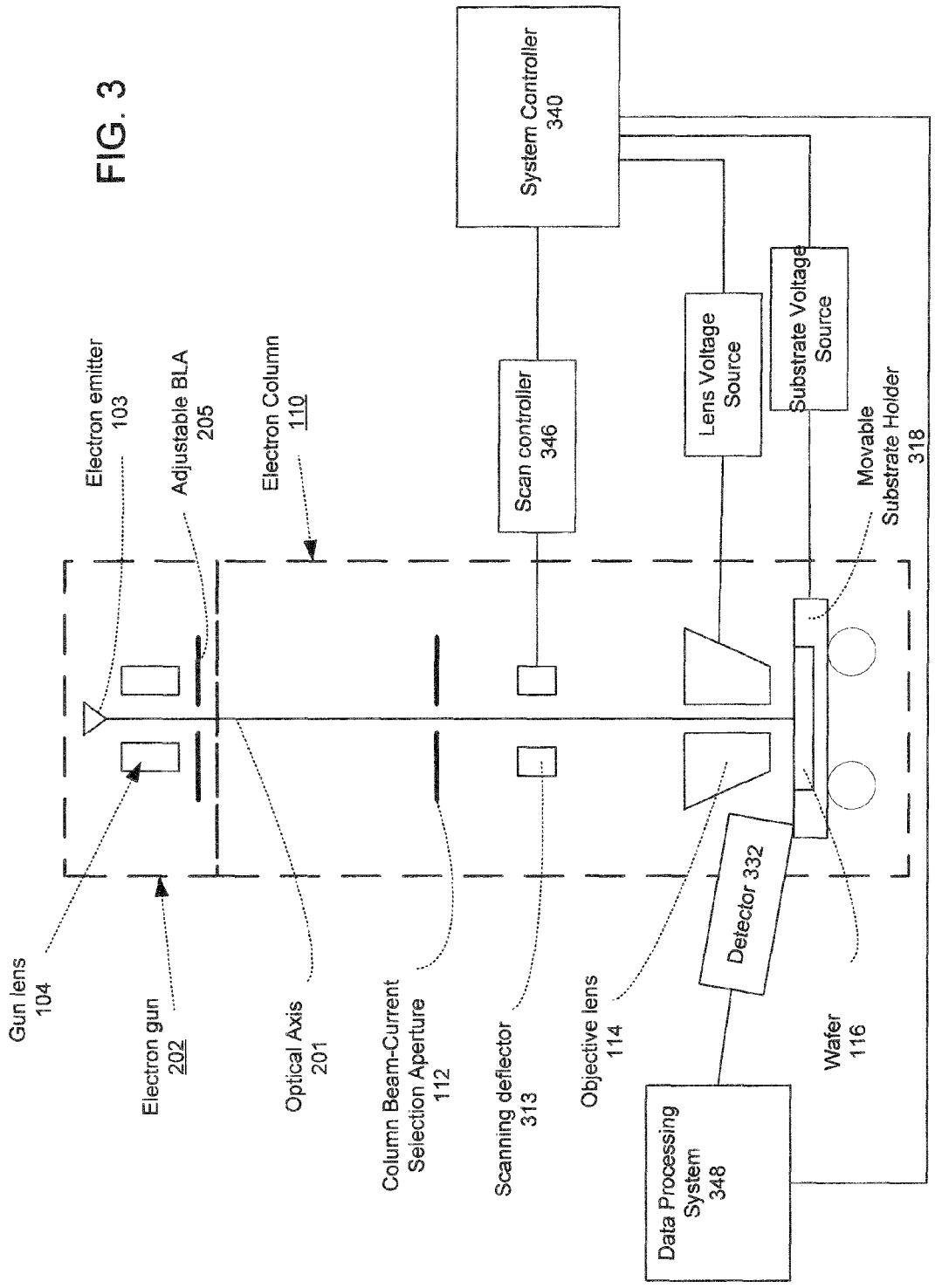
FIG. 3 is a schematic diagram showing further components of an electron beam tool for semiconductor applications in accordance with the first embodiment of the invention.

FIG. 3 is a schematic diagram showing further components of an electron beam tool for semiconductor applications in accordance with the first embodiment of the invention. As shown, the e-beam tool includes an electron gun 102 and an electron column 110.

In the electron gun 102, the electron emitter 103 is a source of electrons, and the gun lens 104 focuses the emitted electrons to form an electron beam. As discussed above, the adjustable BLA 205 is utilized to limit the size of the beam exiting the electron gun 202 and entering into the electron column 110 along the optical axis 106 of the column.

In the electron column 110, the beam-current selection aperture (BSA) 112 is used to select a desired beam current with which to illuminate the target semiconductor wafer (or other target substrate) 116. A scanning deflector 313 may be configured to controllably scan (for example, raster scan) the beam across an area of the wafer 118, and a scan controller 346 may be coupled to the scanning deflector 313 and used to control said deflection.

The objective lens 114 is configured to focus the controllably deflected beam onto the wafer 116. A movable substrate holder 318 may be configured to hold the wafer 116 and transport (move) the wafer 116 under the electron column 110 for the purpose of automated inspection and/or review of defects, or automated measurement of critical dimensions, as part of a semiconductor manufacturing process.

A detector 332 is arranged to detect secondary electrons (and/or backsignal electrons), and a data processing system 348 coupled to the detector 332 is used to store and process the detected data so as to be able to form useful images for analysis.

The apparatus further includes a system controller 340. The system controller 340 may include a processor, memory for executable instructions and data, and various other components. The system controller 340 may be communicatively coupled to the scan controller 346, the data processing system 348, and various other components of the apparatus (such as voltage or current sources for various lenses, and so forth).

Figure 4:
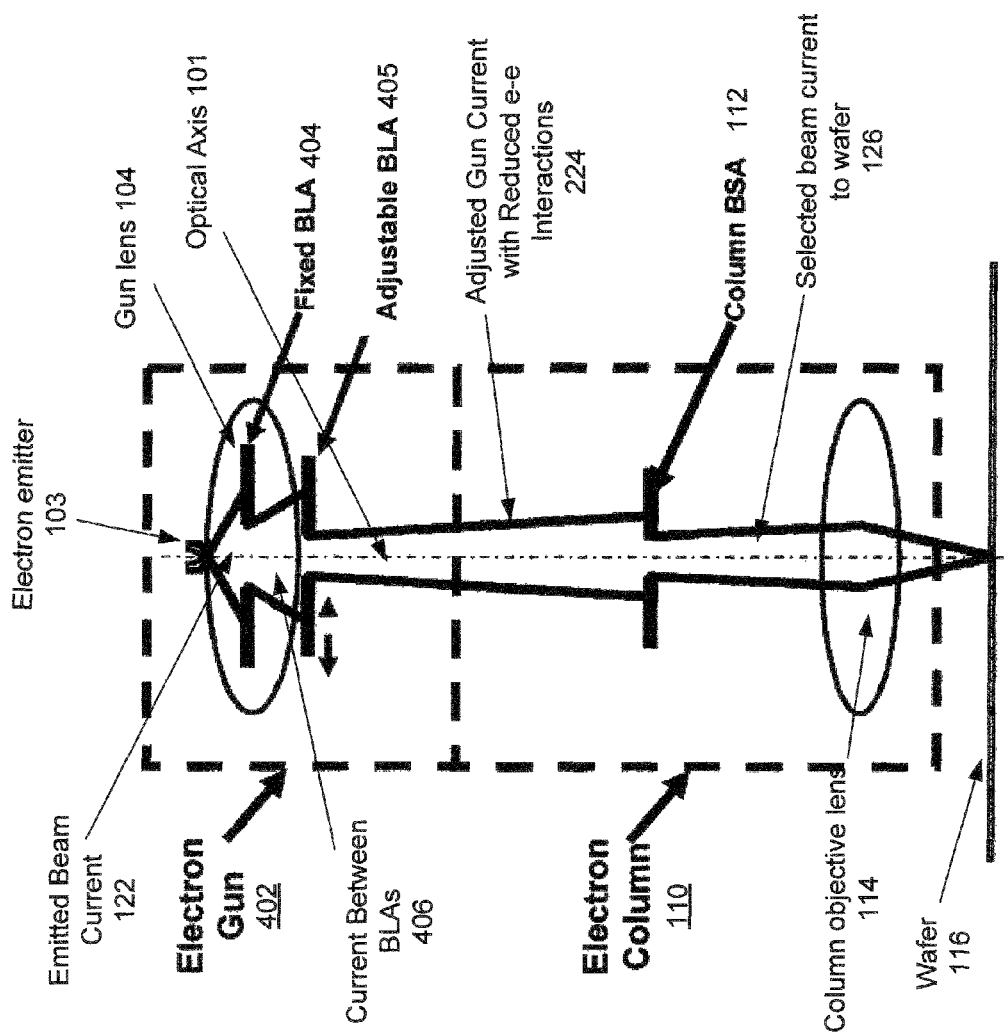
FIG. 4 is a schematic diagram showing select components of an electron beam tool for semiconductor applications in accordance with a second embodiment of the invention.

FIG. 4 is a schematic diagram showing select components of an electron beam tool for semiconductor applications in accordance with a second embodiment of the invention. As seen in FIG. 4, both a fixed BLA 404 (closer to the source) and an adjustable BLA 405 (farther from the source, but much closer than the column BSA) are arranged within the electron gun 402.

The fixed BLA 404 limits the emitted beam and results in a reduced current between BLAs 406. The adjustable BLA 405 further reduces the current and results in an adjusted gun current with reduced electron-electron interactions 224. This enables the e-beam tool to reduce spot blur while maintaining a high BC. In one implementation, the adjustable BLA 405 may have multiple different selectable aperture sizes (for example 4 to 6 sizes). In another implementation, the adjustable BLA 405 may have a tunable aperture size.

Figure 5:
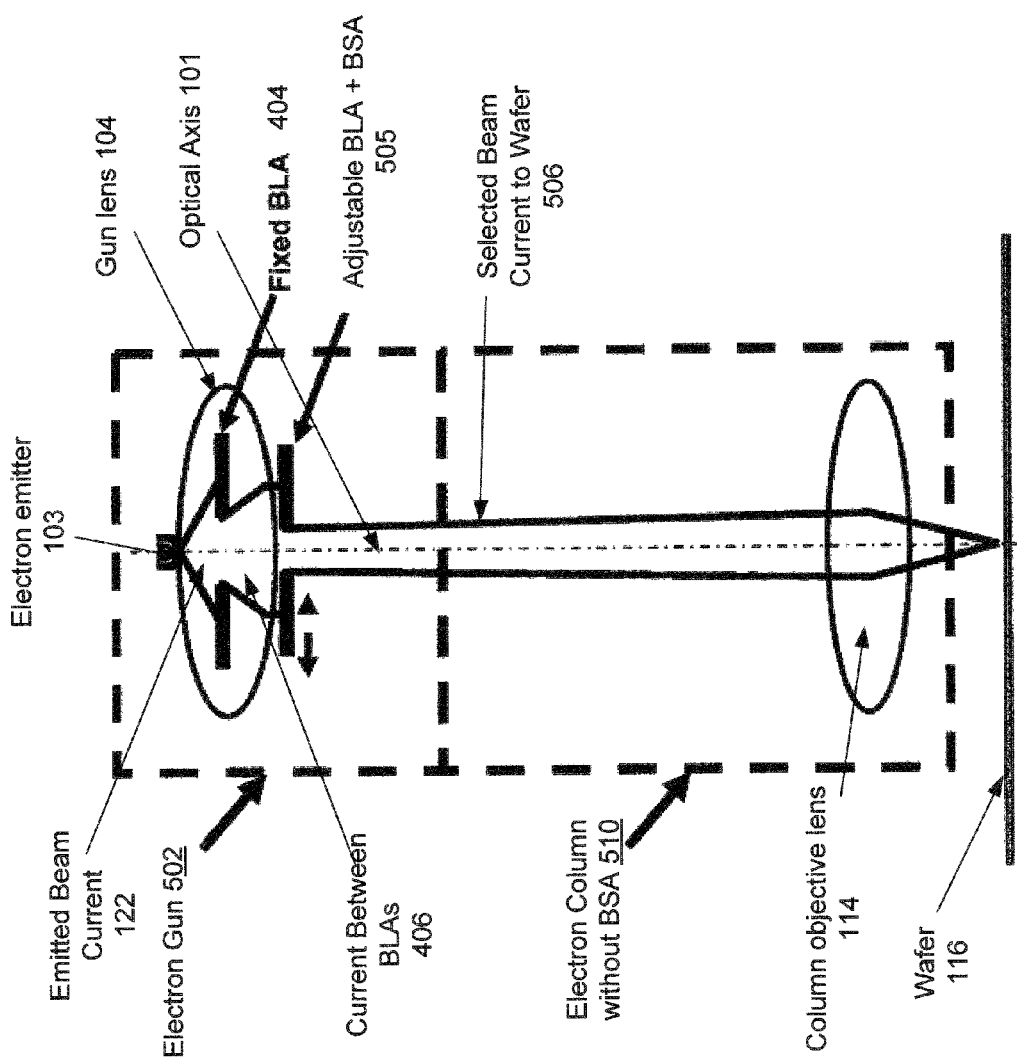
FIG. 5 is a schematic diagram showing select components of an electron beam tool for semiconductor applications in accordance with a third embodiment of the invention.

FIG. 5 is a schematic diagram showing select components of an electron beam tool for semiconductor applications in accordance with a third embodiment of the invention. As seen in FIG. 5, both a fixed BLA 404 and a combined adjustable BLA and BSA 505 are arranged within the electron gun 502.

The fixed BLA 404 limits the emitted beam and results in a reduced current between BLAs 406. The combined adjustable BLA and BSA 505 further reduces the current and also selects a beam current to the wafer 506. In other words, the combined adjustable BLA and BSA 505 provides the functionality of both an adjustable BLA and a BSA. In one implementation, the combined adjustable BLA and BSA 505 may have approximately ten to twelve different selectable aperture sizes. In another implementation, the combined adjustable BLA and BSA 505 may have a tunable aperture size.

As further shown in FIG. 5, in this embodiment, the electron column 510 does not need a BSA. This is because the current to the wafer 506 has already been selected by the combined adjustable BLA and BSA 505 within the electron gun 502.

Figure 6:
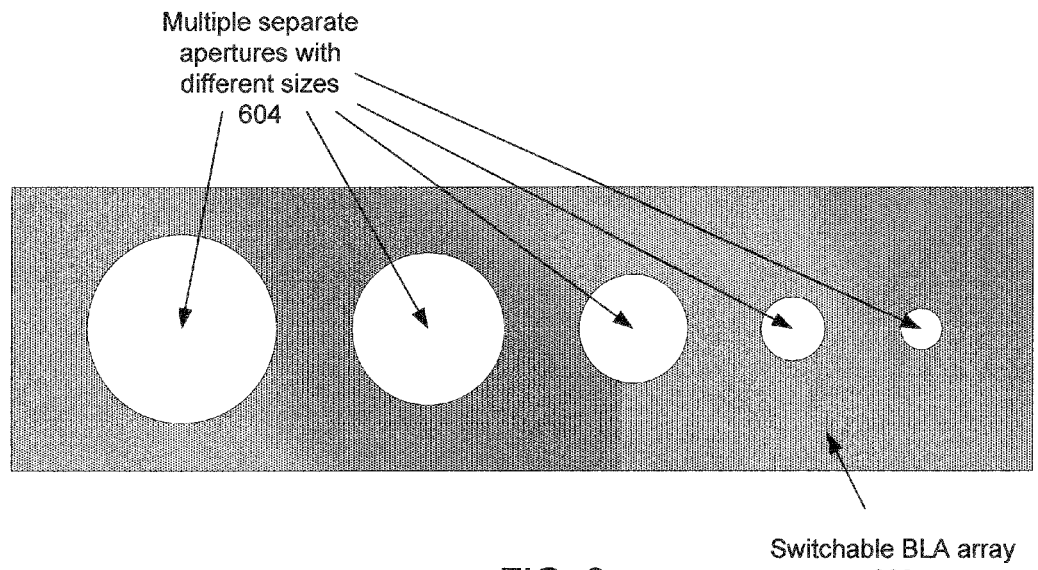
FIG. 6 is a schematic diagram showing a switchable BLA array in accordance with an embodiment of the invention.

FIG. 6 is a schematic diagram showing a switchable BLA array 602 in accordance with an embodiment of the invention. In this embodiment, the switchable BLA array 602 comprises linear array of separate apertures 604 of different sizes. In this implementation, the apertures 604 are arranged by size within the array. The mechanism is moved linearly to select the desired aperture size such that electron-electron interactions may be reduced while maintaining a substantially high current density.

Figure 7:
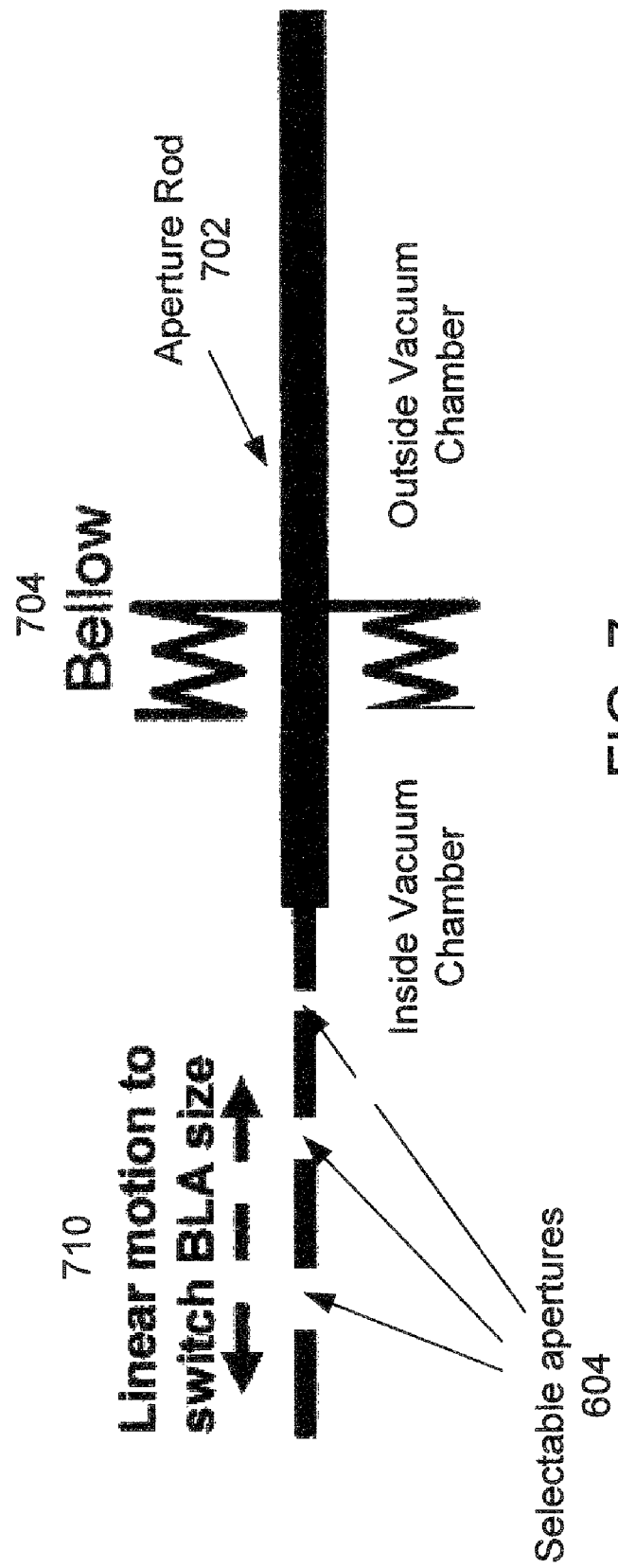
FIG. 7 shows an example mechanism for linearly moving a switchable BLA array in accordance with an embodiment of the invention.

FIG. 7 shows an example mechanism for linearly moving a switchable BLA array in accordance with an embodiment of the invention. As shown, an aperture rod 702 may be attached to the array of selectable apertures 604 within the electron gun chamber, and a bellow 704 may be used so that a portion of the rod may be positioned outside the vacuum environment of the electron gun chamber. A linear motion 710 of the rod may then be used to select different size apertures in the array.

Figure 8:
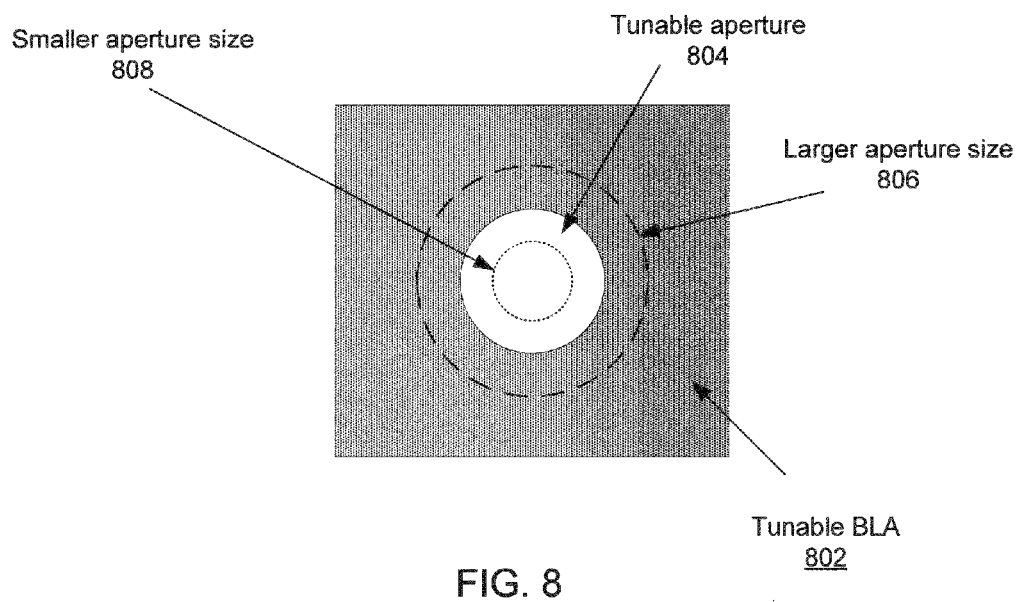
FIG. 8 is a schematic diagram showing a tunable BLA in accordance with an embodiment of the invention.

FIG. 8 is a schematic diagram showing a tunable BLA 802 in accordance with an embodiment of the invention. In this embodiment, the tunable BLA 802 comprises an aperture 804 whose size is tunable in that it may be adjusted to be larger (806) or smaller (808) without having to shift BLA position with a large traveling distance inside vacuum.

Figure 9:
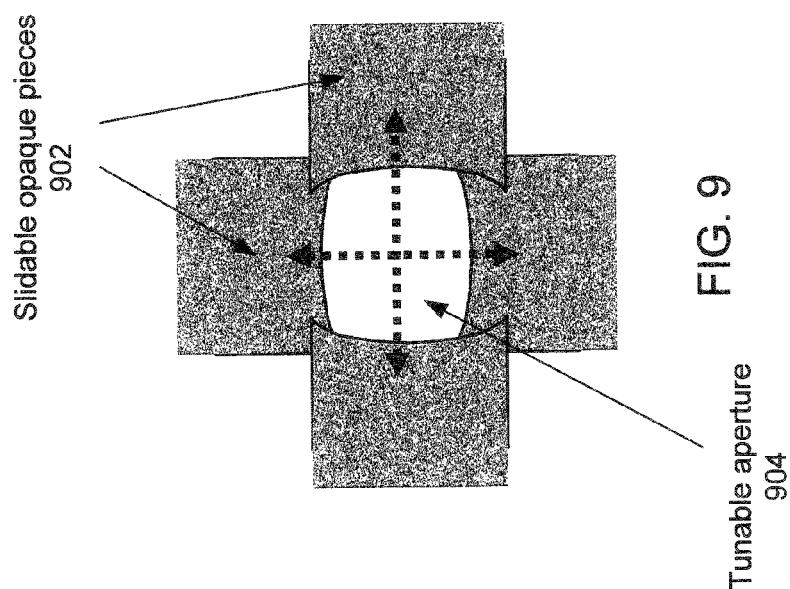
FIG. 9 shows an example mechanism for tuning a size of a BLA in accordance with an embodiment of the invention.

FIG. 9 shows an example mechanism for tuning a size of a BLA in accordance with an embodiment of the invention. As shown, slidable electron-opaque pieces 902 may be used to effectively create a tunable aperture 904.

Figure 10:
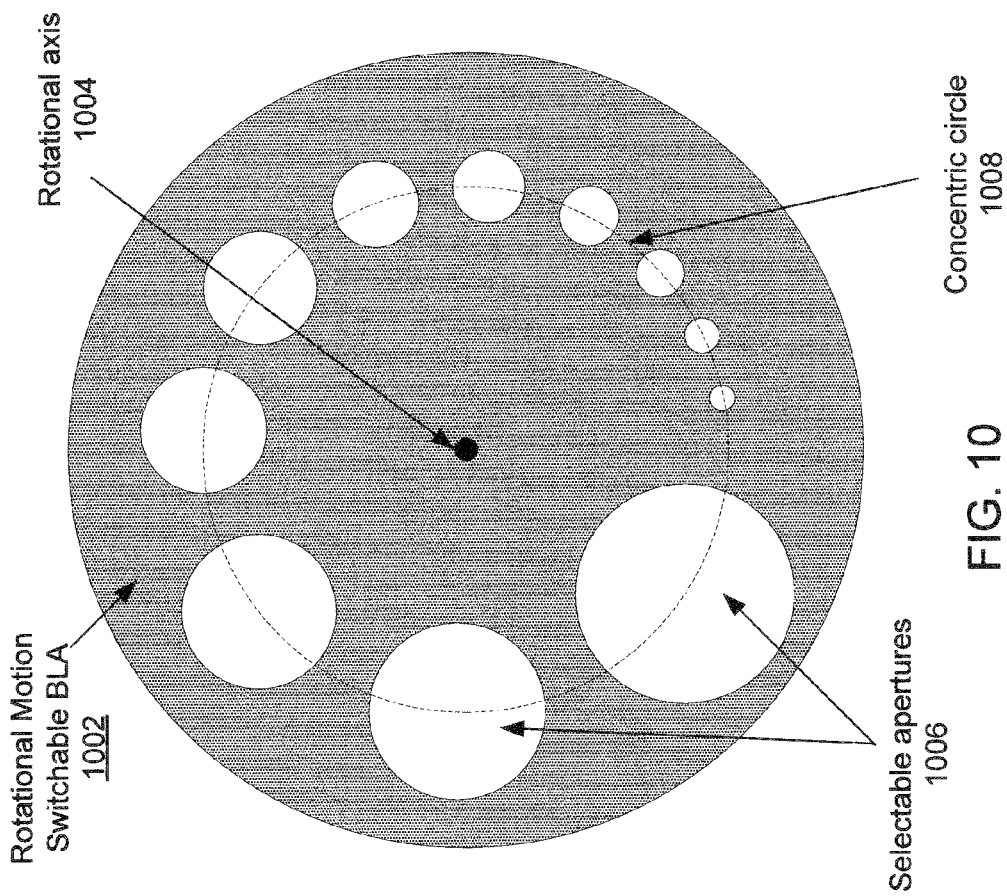
FIG. 10 is a schematic diagram showing a rotational switchable BLA in accordance with an embodiment of the invention.

FIG. 10 is a schematic diagram showing a rotational motion switchable BLA 1002 in accordance with an embodiment of the invention. As shown, a plurality of selectable apertures 1006 may be formed in an electron-opaque disk. The selectable apertures 1006 may be arranged, for example, such that their centers lie on a circle 1008 which is concentric with a rotational axis 1004 of the disk.

FIG. 11 is a schematic diagram showing a matrix for controlling beam current in accordance with an embodiment of the invention. As seen, rough control of the beam current may be provided by selection of the BLA size, while fine control of the beam current may be provided by control of the angular current density (Ja) of the electron source (for example, by varying the gun extraction voltage).

In the example shown, a lowest range for the beam current (Range 1) may be chosen by selecting a small BLA and a low Ja. A next range of the beam current (Range 2) may be chosen by selecting a small BLA and a high Ja. In general, Range 2 is higher than Range 1, but there may be overlap between the two ranges. A next range of the beam current (Range 3) may be chosen by selecting a large BLA and a low Ja. In general, Range 3 is higher than Range 2, but there may be overlap between the two ranges. Finally, a highest range of the beam current (Range 4) may be chosen by selecting a large BLA and a high Ja. In general, Range 4 is higher than Range 3, but there may be overlap between the two ranges. In addition, the BSA used may be selected so as to control the beam current within each range.

While FIG. 11 shows two settings for the rough control (small BLA or large BLA), the rough control may be implemented with more than two settings. In addition, while FIG. 11 shows two ranges for the fine control (low Ja and high Ja), the fine control may be implemented with more than two ranges.

In accordance with an embodiment of the invention, a user may set a beam current to be utilized by the electron beam apparatus. The control electronics of the apparatus may then controllably select or adjust the BLA size and the angular current density (Ja) so as to provide a range which includes the user-set beam current. In addition, the BSA size may be varied or selected to achieve the user-set beam current.

Figure 12:
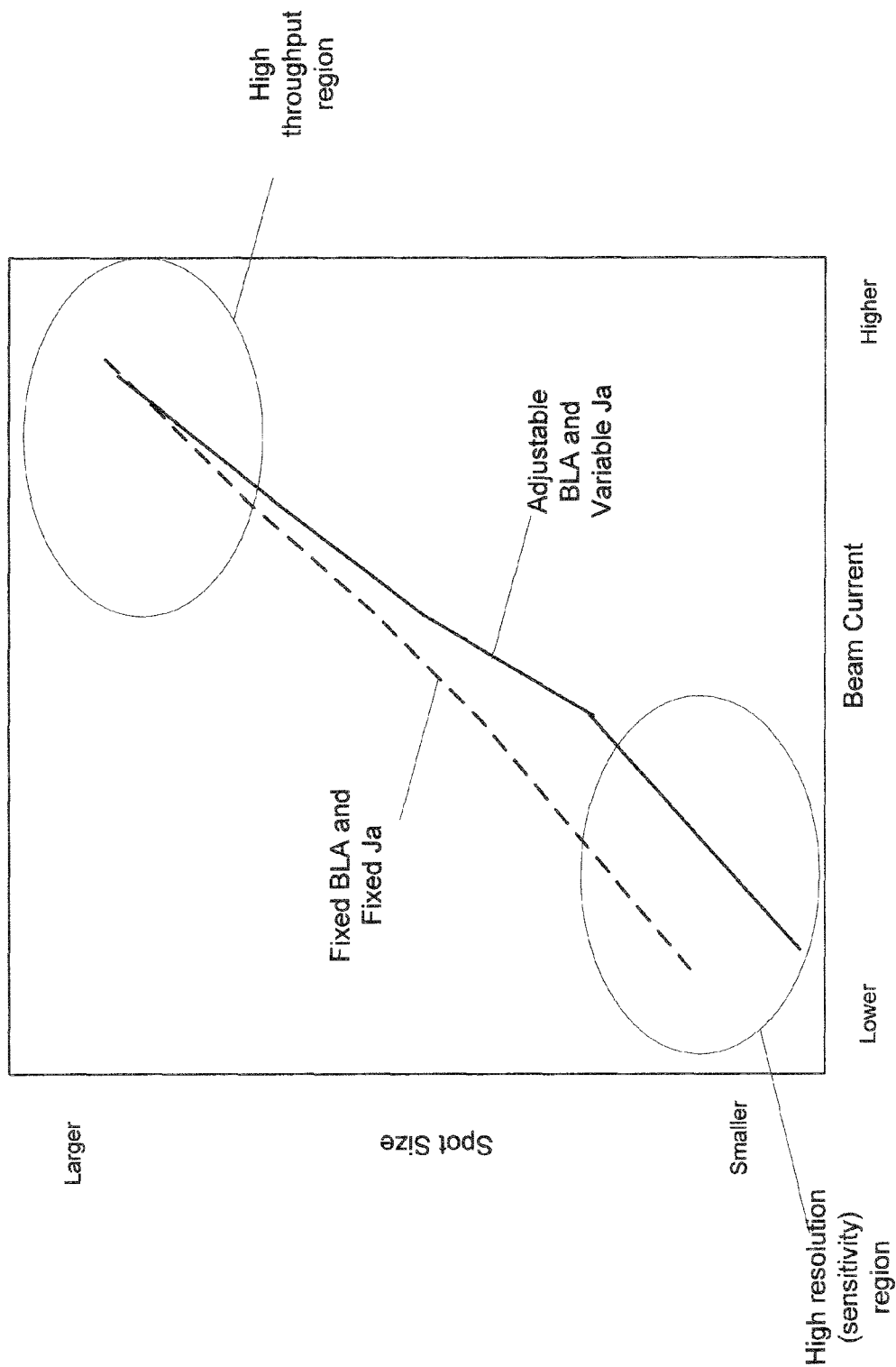
FIG. 12 is a graph showing an improvement in resolution and/or throughput which is obtainable in accordance with an embodiment of the invention.

FIG. 12 is a graph showing an improvement in resolution and/or throughput which is obtainable in accordance with an embodiment of the invention. The dashed line in the graph shows spot size versus beam current for the conventional apparatus with fixed BLA and fixed Ja. In comparison, the solid line in the graph shows spot size versus beam current for the apparatus with adjustable BLA and variable Ja in accordance with an embodiment of the invention.

As seen, the solid line is generally lower than the dashed line. This indicates that, at the same beam current, the spot size achievable is much smaller for the apparatus with adjustable BLA and variable Ja. Alternatively, this indicates that, at a same spot size, the beam current achievable is much higher for the apparatus with adjustable BLA and variable Ja.

The above-described diagrams are not necessarily to scale and are intended be illustrative and not limiting to a particular implementation. The above-described invention may be used, for example, in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. For example, various lenses or deflectors disclosed herein may be magnetic and/or electric. The detection of the secondary and/or backsignal electrons may occur outside and/or through the objective lens. The sample may or may not be immersed in the magnetic and/or electric field.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron-beam apparatus for defect inspection and/or review of substrates or for measuring critical dimensions of features on substrates, the apparatus comprising:
   an electron gun including an electron source configured to generate electrons for an electron beam and a tunable adjustable beam-limiting aperture which is configured to select and use one aperture size from a continuous range of aperture sizes; and
   an electron column including an objective lens for focusing the electron beam onto the target area, a movable substrate holder for holding the substrate, and a detector configured to detect signal electrons.

2. The apparatus of claim 1, wherein the adjustable beam-limiting aperture is configured to be adjustable while in a high vacuum environment of the electron gun.

3. The apparatus of claim 1, further comprising a beam-current selection aperture in the electron column which is configured with a plurality of apertures for selecting a beam current to be focused onto a spot on the substrate.

4. The apparatus of claim 1, further comprising a fixed beam-limiting aperture in the electron gun, wherein the fixed beam-limiting aperture is arranged in between the electron source and the adjustable beam-limiting aperture.

5. The apparatus of claim 4, wherein the apparatus is further configured so that the adjustable beam-limiting aperture in the electron gun also selects a beam current to be focused onto the substrate such that the adjustable beam-limiting aperture also function as a beam-current selection aperture.

6. The apparatus of claim 4, further comprising a beam-current selection aperture in the electron column which is configured with a plurality of apertures for selecting a beam current to be focused onto a spot on the substrate.

7. An electron-beam apparatus for defect inspection and/or review of substrates or for measuring critical dimensions of features on substrates, the apparatus comprising:
   an electron gun including an electron source configured to generate electrons for an electron beam and an adjustable beam-limiting aperture which is configured to select and use one aperture size from a range of aperture sizes;
   an electron column including an objective lens for focusing the electron beam onto the target area, a movable substrate holder for holding the substrate, and a detector configured to detect signal electrons; and
   a fixed beam-limiting aperture in the electron gun, wherein the fixed beam-limiting aperture is arranged in between the electron source and the adjustable beam-limiting aperture,
   wherein the apparatus is further configured so that the adjustable beam-limiting aperture in the electron gun also selects a beam current to be focused onto the substrate such that the adjustable beam-limiting aperture also function as a beam-current selection aperture, and
   wherein the adjustable beam-limiting aperture in the electron gun includes at least ten different aperture sizes.

8. The apparatus of claim 7, wherein the adjustable beam-limiting aperture comprises a switchable array of apertures.

9. The apparatus of claim 8, wherein the switchable array of apertures includes a plurality of apertures in a linear array.

10. The apparatus of claim 8, wherein the switchable array of apertures includes a plurality of apertures in a circular array.

11. A method of providing an electron beam in a semiconductor manufacturing tool for defect inspection and/or review of substrates or for measuring critical dimensions of features on substrates, the method comprising:
   generating electrons for an electron beam by an electron source in an electron gun;
   providing an adjustable beam-limiting aperture with a continuous range of aperture sizes in the electron gun;
   selecting one aperture size from the range of aperture sizes of the adjustable beam-limiting aperture;
   focusing the electron beam onto a target area of the substrate; and
   detecting signal electrons.

12. The method of claim 11, wherein the selection of the aperture size is performed while the beam-limiting aperture is within in a high vacuum environment of the electron gun.

13. The method of claim 11, further comprising:
   providing a fixed beam-limiting aperture in the electron gun, wherein the fixed beam-limiting aperture is arranged in between the electron source and the adjustable beam-limiting aperture.

14. A method of providing an electron beam in a semiconductor manufacturing tool for defect inspection and/or review of substrates or for measuring critical dimensions of features on substrates, the method comprising:
   generating electrons for an electron beam by an electron source in an electron gun;
   providing an adjustable beam-limiting aperture with a range of aperture sizes in the electron gun;
   selecting one aperture size from the range of aperture sizes of the adjustable beam-limiting aperture;
   focusing the electron beam onto a target area of the substrate; and
   detecting signal electrons,
   wherein the selection of the aperture size is performed by linear motion so that a center of the selected aperture is coincidental with an optical axis in the electron gun.

15. A method of providing an electron beam in a semiconductor manufacturing tool for defect inspection and/or review of substrates or for measuring critical dimensions of features on substrates, the method comprising:
   generating electrons for an electron beam by an electron source in an electron gun;
   providing an adjustable beam-limiting aperture with a range of aperture sizes in the electron gun;
   selecting one aperture size from the range of aperture sizes of the adjustable beam-limiting aperture;
   focusing the electron beam onto a target area of the substrate; and
   detecting signal electrons,
   wherein the selection of the aperture size is performed by rotational motion so that a center of the selected aperture is coincidental with an optical axis in the electron gun.

16. A method of providing an electron beam in a semiconductor manufacturing tool for defect inspection and/or review of substrates or for measuring critical dimensions of features on substrates, the method comprising:
   generating electrons for an electron beam by an electron source in an electron gun;
   providing an adjustable beam-limiting aperture with a range of aperture sizes in the electron gun;
   selecting one aperture size from the range of aperture sizes of the adjustable beam-limiting aperture;
   focusing the electron beam onto a target area of the substrate; and
   detecting signal electrons,
   wherein the selection of the aperture size is performed by contracting or expanding a size of the beam-limiting aperture in the electron gun.

17. An automated method of providing an electron beam in an electron imaging apparatus, the method comprising:
   generating electrons for an electron beam by an electron source in an electron gun;
   setting a beam current to be used in the apparatus by a user; and
   providing a range of beam currents which includes said user-set beam current by using a microcontroller to select a size of an adjustable beam-limiting aperture in the electron gun and to select an angular beam current density, wherein the adjustable beam-limiting aperture is adjustable over a continuous range of sizes.

18. The automated method of claim 17, further comprising:
   using a microcontroller to change a size of a beam current selection aperture to achieve said user-set beam current within said range.

* * * * *